United States Patent
Watanabe

(10) Patent No.: US 7,415,730 B2
(45) Date of Patent: Aug. 19, 2008

(54) MICROCOMPUTER AND TEST METHOD THEREFORE

(75) Inventor: Mitsuhiro Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 765 days.

(21) Appl. No.: 10/688,897

(22) Filed: Oct. 21, 2003

(65) Prior Publication Data

US 2004/0111655 A1    Jun. 10, 2004

(30) Foreign Application Priority Data

Dec. 6, 2002    (JP)    ............................. 2002-354726

(51) Int. Cl.
   G06F 7/04      (2006.01)
   G06F 17/30     (2006.01)
   G06K 9/00      (2006.01)
   H03M 1/68      (2006.01)
   H04K 1/00      (2006.01)

(52) U.S. Cl. ........................... 726/26; 710/260; 714/30; 713/193

(58) Field of Classification Search .................... 726/26
   See application file for complete search history.

(56) References Cited

U.S. PATENT DOCUMENTS

| 4,519,032 A | * | 5/1985 | Mendell .................... 711/173 |
| 5,280,618 A | * | 1/1994 | Takagi ....................... 710/260 |
| 5,506,396 A | * | 4/1996 | Asami ....................... 235/492 |
| 5,657,330 A | * | 8/1997 | Matsumoto ................ 714/733 |
| 5,671,394 A | * | 9/1997 | Katsuta ..................... 711/164 |
| 5,826,007 A | * | 10/1998 | Sakaki et al. ................ 714/42 |

FOREIGN PATENT DOCUMENTS

| JP | 06-324972 | 11/1994 |
| JP | 08-272695 | 10/1996 |

* cited by examiner

Primary Examiner—Emmanuel L Moise
Assistant Examiner—Shewaye Gelagay
(74) Attorney, Agent, or Firm—Volentine & Whitt, P.L.L.C.

(57) ABSTRACT

When a test mode signal is rendered active by a signal given from an external terminal, a CPU reads and runs various self-testing programs stored in a ROM. When any of the test programs comes to a process of testing a security circuit, a security test signal is rendered active and when a predetermined address is accessed then, a selector is switched to a register side by the output signal of an AND circuit of a test circuit. An illegitimate instruction, for example, is set in the register and is given to the CPU. Whether the security circuit has failure is determined by checking if an illegitimate access detection signal is output when the CPU executes the illegitimate instruction.

3 Claims, 5 Drawing Sheets

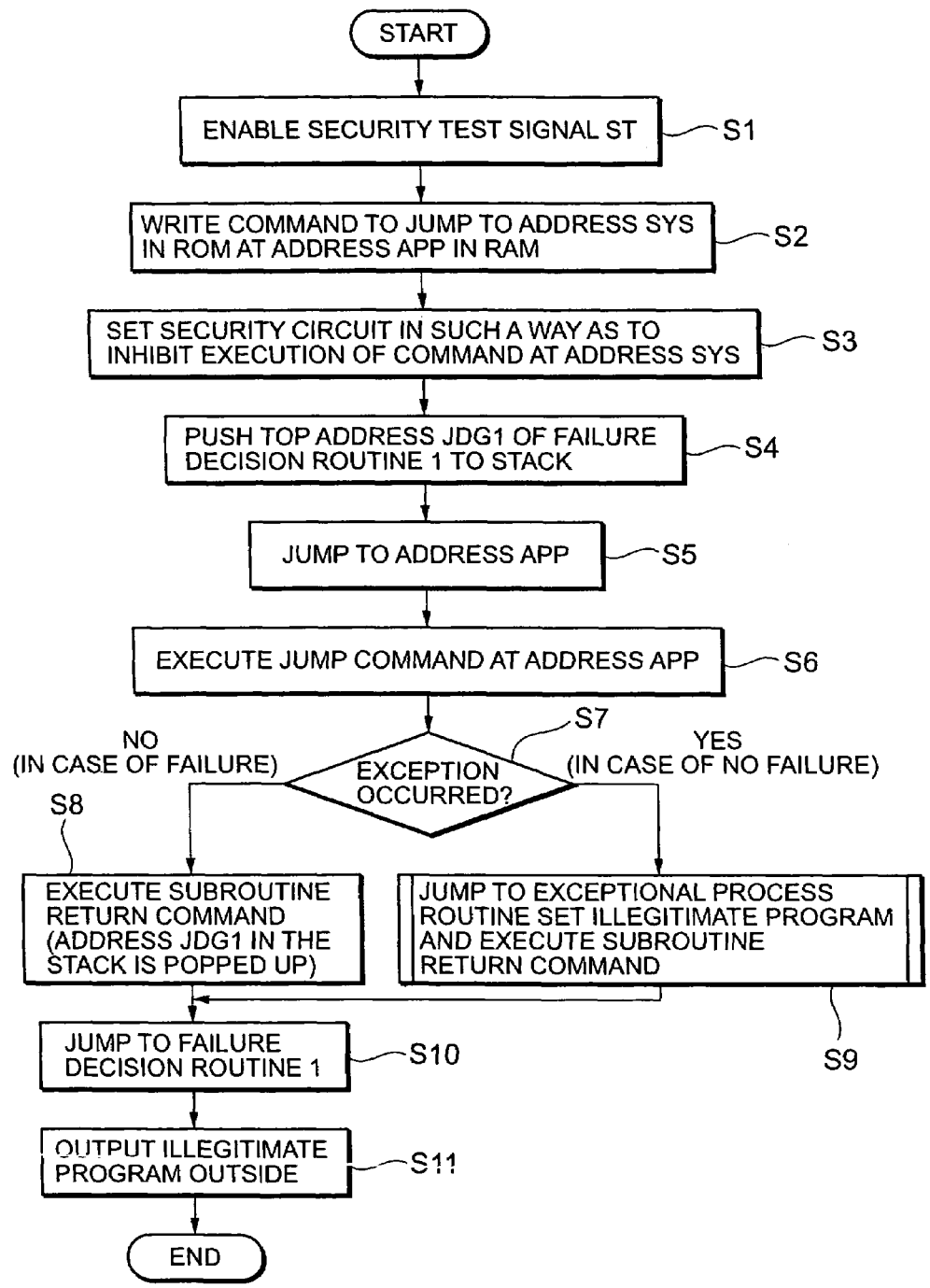

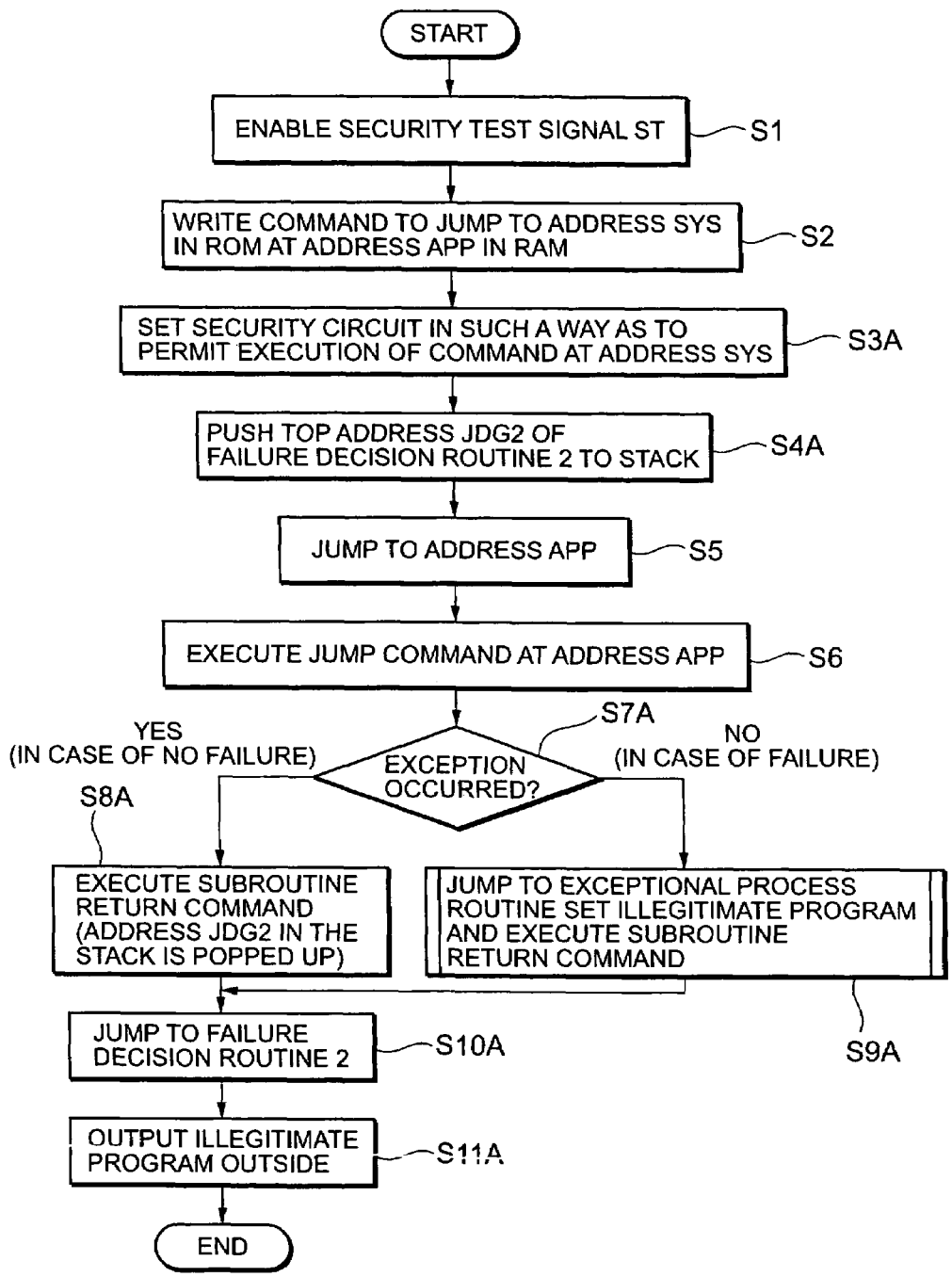

MICROCOMPUTER AND TEST METHOD THEREFORE

BACKGROUND OF THE INVENTION

1. Field of the Invention

The present invention relates to a microcomputer having a security function, such as an IC card, and, more particularly, to a microcomputer having a test circuit for testing the security function and a test method therefor.

2. Description of the Related Art

In general, LSIs (Large Scale Integration circuits) suffer operational defects originated from productional defects at a certain probability in the fabrication process of making fine processes on silicon wafers or assembling the LSIs into packages. At the time of fabrication, therefore, a supply voltage and a signal are applied to completed LSIs to test if the LSIs operate as expected and a defective LSI, if any, is then removed. To improve the controllability and observability, a test facilitating design to preinstall a test circuit, such as a circuit with a scan capability, is taken at the time of designing logics of each LSI.

The "controllability" means the capability to set an arbitrary signal in an LSI to any level ("H" or "L") and the "observability" means the capability to detect the level of an arbitrary signal in an LSI. Because it is not possible to output the levels of all the signals from an LSI and directly detect them, the scan capability employs such a structure as to output the levels of the internal signals as variations in output patterns of specific terminals.

To increase the controllability and observability is to be able to control and detect internal signals, and therefore means lowering the security level in case of an LSI associated with security. In other words, an improvement on the controllability and observability makes it easier to read data which should not be known by an unauthorized person, such as a password or a private key.

For a microcomputer for an IC card, particularly, the ISO 7816 standards define terminal shapes and the electric characteristics of signals and limit the number of external connection terminals to five, namely, power supply terminals (VDD and GND), clock terminal (CLK), reset terminal (RST) and a serial data terminal (SIO) for half duplex communication. Because of its security usage and fewer terminals for external connection, such a microcomputer has various restrictions on testing.

Further, a microcomputer for advanced security, which can download an application program from outside and run the program, requires an advanced security function to execute a specific instruction in an application program and inhibit an access and jump or the like to a specific area in order to protect against a process of downloading an illegitimate program and reading and writing data, such as a password and a private key.

FIG. 2 is structural diagram showing one example of a conventional microcomputer having the aforementioned function.

This microcomputer has a CPU (Central Processing Unit) 1, ROMs (Read Only Memories: non-volatile memories) 2 and 3, a RAM (Random Access Memory) 4, a peripheral circuit 5, a bus (or bridge) 6, a security circuit 7, a test circuit 8 and a test mode detection circuit 9.

The CPU 1 executes instructions stored in memories, such as the ROMs 2 and 3, one after another. The ROM 2 is a memory where a program, such as an OS (Operating System), which determines the main operations of the microcomputer, is stored. The ROM 3 is a memory where a program for a chip production test, a minimum library for security, sub routines for function calls and the like are stored.

The RAM 4 is a memory to store data and temporarily store a program, and includes a non-volatile memory which is electrically reprogrammable. The peripheral circuit 5 performs encryption and communication with an external circuit. The bus 6 connects the CPU 1 to other circuits, such as the ROMs 2 and 3, and is a bridge circuit which makes a bus connection, such as a tristate bus or OR bus, and adjusts logics and a timing between blocks.

The security circuit 7 monitors addresses or instructions, read by the CPU 1, one after another and sends an illegitimate access detection signal IL to the CPU 1 to cause the CPU 1 to perform an adequate process when there has been an access to a program area or a data area an access to which to execute a instruction or write or read data is not permitted.

The test circuit 8 has a plurality of test signal input terminals 8a provided on the chip but connected to no external circuit and a selector 8b whose switching is controlled by a test mode signal TM. The test circuit 8 gives test instructions to the CPU 1 from the test signal input terminals 8a through the probe of a testing apparatus at the time of carrying out a production test and causes the CPU 1 to execute a sequence of arbitrary instructions to test if the CPU 1 can properly execute the application program or if the peripheral circuit 5 operates properly.

The test mode detection circuit 9 detects the pattern of a specific sequence of signals given to the terminals CLK, RST and SIO and enables the test mode signal TM for the test circuit 8 to indicate that the microcomputer has been set to the test mode.

In the testing operation that is executed at the time of manufacturing such a microcomputer, a specific signal pattern for setting the test mode is given to the terminals CLK, RST and SIO. This enables the test mode signal TM output from the test mode detection circuit 9, thus connecting the test signal input terminals 8a of the test circuit 8 to the CPU 1. Further, test instructions are given to the test signal input terminals 8a of the test circuit 8 and the CPU 1 is allowed to execute a sequence of arbitrary instructions to test if the CPU 1 can properly execute the application program or if the peripheral circuit 5 operates properly.

In the normal operation mode, the security circuit 7 always monitors an address ADR output from the CPU 1 and determines whether or not an access is directed to within an allowed area. If the access is directed to an allowed area, the instructions read from the memory, such as the ROM 2 or ROM 3, are directly executed by the CPU 1. If the access is directed to an unauthorized area, the security circuit 7 outputs the illegitimate access detection signal IL and the CPU 1 performs a process such as interruption of the execution of the program or invalidation of the access.

The conventional microcomputer however has the following problems.

(a) The test circuit 8 has the test signal input terminals 8a to provide test instructions supplied from an external testing apparatus. Because the test signal input terminals 8a, though not connected to external input/output pins, are formed on the chip as test pads, there is a danger that a malignant third party performs security violation, such as reading data through the pads or downloading an illegitimate program.

(b) In case where the wire pattern for the illegitimate access detection signal IL is short-circuited with the power supply GND or VDD or the transistor which outputs the illegitimate access detection signal IL from the security circuit 7 has an operational failure, it is not possible to detect that the illegitimate access detection signal IL is not output properly. The reason for this shortcoming is as follows.

The CPU 1 should self-test the security function based on the test program stored in the ROM 3 and output data indicating the presence/absence of a failure from the terminals CLK, RST and SIO. To achieve it, the user application stored in, for example, the RAM 4 should cause an exceptional state (a state where execution of an illegitimate instruction has been detected) and the CPU 1 should detect the exceptional state and detect that the exceptional state does not occur in the proper operation mode as the flow of execution of the test program or a change in read data, without executing a program at the jumping destination. The reason why the program at the jumping destination cannot be run is that the OS is stored in the ROM 2 and it is not possible to specify which instruction is stored at which address, so that if the program at the jumping destination is run, the subsequent operation of the CPU 1 cannot be specified and the flow cannot return to the test program. Therefore, the structure of the microcomputer in FIG. 2 cannot carry out such a process.

SUMMARY OF THE INVENTION

The present invention provides a microcomputer comprising a first memory where a normal-operation program is stored; a second memory where a functional test program stored; a test mode detection circuit which monitors a signal supplied through an external terminal and detects if a test mode is designated; a central processing unit (CPU) which accesses the first memory and runs the normal-operation program when the test mode is not designated, and accesses the second memory and runs the functional test program when the test mode is designated; a memory management unit which monitors an access address and data with respect to the first and second memories and causes the CPU to execute a specific operation when there has been an unauthorized illegitimate access; and a test circuit which gives a preset specific instruction to the CPU when, in the test mode, a security test signal has been output from the CPU and a specific memory area has been accessed.

Having the above architecture, the microcomputer according to the invention operates as follows in a functional test.

When the test mode is set by a signal input to the external terminal and is detected by the test mode detection circuit, the CPU reads the program from the second memory and executes a functional test. When a security test signal is output and a specific memory area is accessed in the functional test, a preset specific instruction is supplied to the CPU from the test circuit. If this specific instruction is so set to make an illegitimate access, therefore, the memory management unit should perform such control as to cause the CPU to perform a specific operation when the instruction is executed. If the specific operation does not take place, it is apparent that the memory management unit has failed.

BRIEF DESCRIPTION OF THE DRAWINGS

FIG. 3 is a flowchart (part 1) illustrating the operation of the microcomputer in FIG. 1;

FIG. 4 is a flowchart (part 2) illustrating the operation of the microcomputer in FIG. 1.

DETAILED DESCRIPTION OF THE PREFERRED EMBODIMENT

Figure 1:
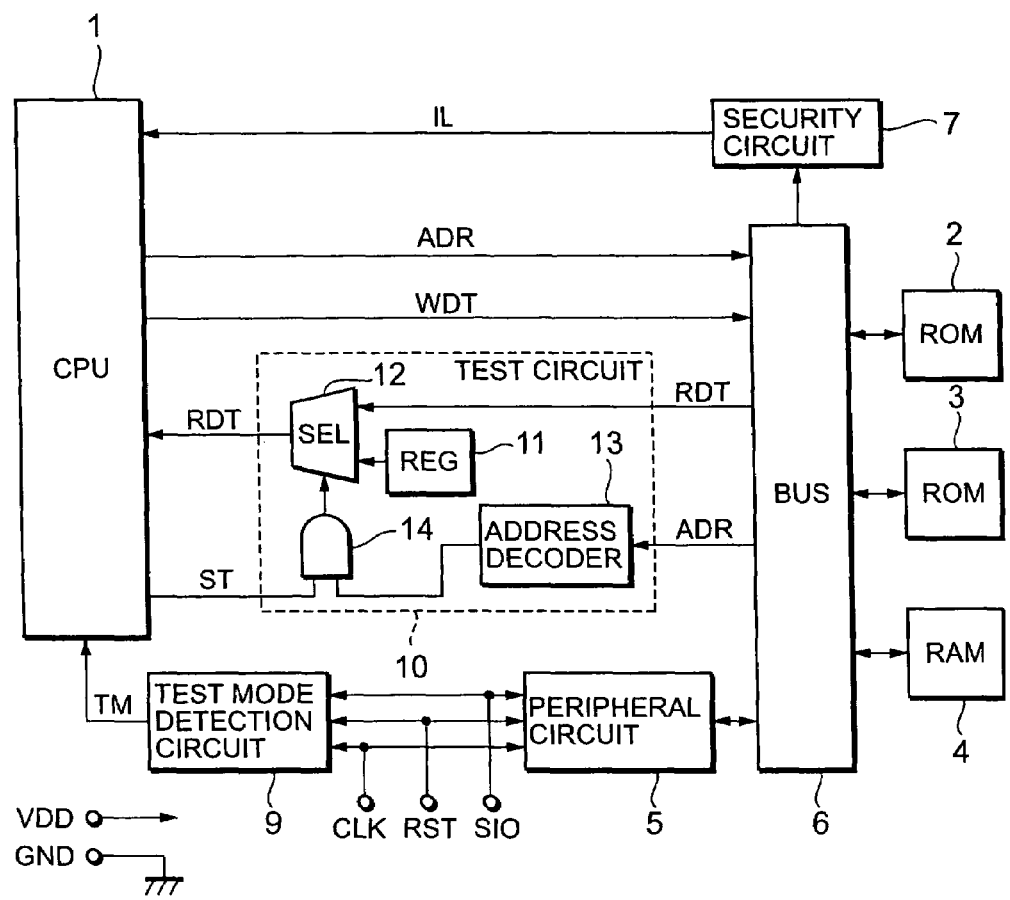
FIG. 1 is structural diagram of a microcomputer according to one embodiment of the invention.
Figure 2:
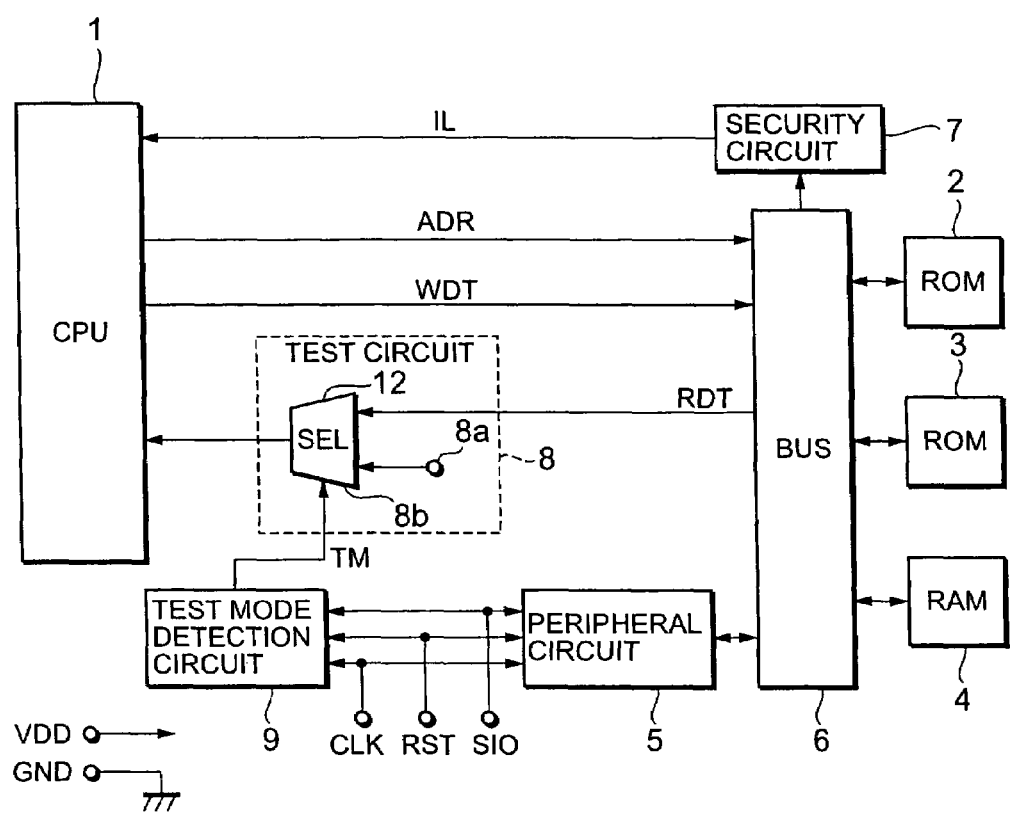
FIG. 2 is structural diagram showing one example of a conventional microcomputer.

FIG. 1 is structural diagram of a microcomputer according to one embodiment of the invention and same reference numerals are given to those components in FIG. 1 which are the same as the corresponding components of the microcomputer in FIG. 2.

This microcomputer, which has a security function, has a CPU 1, ROMs 2 and 3, a RAM 4, a peripheral circuit 5, a bus (or bridge) 6, a security circuit 7 and a test mode detection circuit 9, which are similar to those shown in FIG. 2, and a test circuit 10 different from the test circuit 8 in FIG. 2.

The CPU 1 executes instructions stored in memories, such as the ROMs 2 and 3, one after another. The ROM 2 is a read only memory where a program, such as an OS, which determines the main operations of the microcomputer, is stored. The ROM 3 is a read only memory where a program for a chip production test, a minimum library for security, sub routines for function calls and the like are stored.

The RAM 4 is a memory to store data and temporarily store a program, and includes a non-volatile memory which is electrically reprogrammable. The peripheral circuit 5 performs encryption and communication with an external circuit. The bus 6 connects the CPU 1 to other circuits, such as the ROMs 2 and 3, and is a bridge circuit which makes a bus connection, such as a tristate bus or OR bus, and adjusts logics and a timing between blocks.

The security circuit 7, also called as a memory management unit, monitors addresses or instructions, read by the CPU 1, one after another and sends an illegitimate access detection signal IL to the CPU 1 to cause the CPU 1 to perform an adequate process when there has been an access to a program area or a data area an access to which to execute a instruction or write or read data is not permitted.

The test mode detection circuit 9 detects that the LSI has been set to a test mode from the pattern of a specific sequence of signals given from the terminals CLK, RST and SIO and enables the test mode signal TM for the CPU 1. To prevent the mode from being erroneously shifted to the test mode during the normal operation, a signal pattern that cannot be generated in the normal operation is given to the terminals CLK, RST and SIO. One available example of the scheme that achieves the purpose is to give a specific signal pattern to the terminal SIO in synchronism with a clock to the terminal CLK during the reset (RST="L") period and allows the program of the LSI to identify the signal pattern to enter the test mode.

The test circuit 10 allows the CPU 1 to execute test instructions at the time of carrying out a production test and tests if the CPU 1 can properly execute the application program or if the peripheral circuit 5 operates properly.

The test circuit 10 has a register 11, a selector 12, an address decoder 13 and an AND (logical product) gate 14. The register 11 stores a specific instruction code. The selector 12 selects either read data RDT read from any one of the memories 2 to 4 and output via the bus 6, or the specific instruction code stored in the register 11 and sends the selected one to the CPU 1.

The address decoder 13 decodes the address ADR output from the bus 6 and renders its output signal active when the ROM 2 is selected. The AND gate 14 outputs a switch signal to switch the selector 12 to the register (11) side when a security test signal ST given from the CPU 1 and the output signal of the address decoder 13 both become active.

FIGS. 3 and 4 are flowcharts (parts 1 and 2) illustrating the operation of the microcomputer in FIG. 1. Referring to FIGS. 3 and 4, the operation of the microcomputer in FIG. 1 in test mode will be discussed.

FIG. 3 illustrates process procedures of a program to test if there is a failure which allows execution of a instruction on the ROM 2 when the application program stored in the RAM 4 jumps to that area in the ROM jumping to which is inhibited. It is assumed here that jump from an address APP in the RAM 4 where the application program is stored to an address SYS in the ROM 2 where the OS is stored has been permitted.

First, a signal pattern for setting the test mode is applied to the terminals CLK, RST and SIO. This enables the test mode signal TM output from the test mode detection circuit 9 so that the CPU 1 starts running the test program stored in the ROM 3.

In step S1 in FIG. 3, the security test signal ST output from the CPU 1 is enabled.

In step S2, a instruction code to jump to the address SYS in the OS is written at the address APP in the application program in the RAM 4. Accordingly, as the CPU 1 executes the instruction at the address APP, jump from the application program to the OS can be achieved.

In step S3, the security circuit 7 is set so as to inhibit the execution of the program at the address APP in the application program.

In step S4, a top address JDG1 in a failure decision routine 1 in the test program is pushed in a stack.

In step S5, jump to the address APP is done. Specifically, the test program executes the jump instruction to jump to the address APP. This causes the value APP to be transferred to a program counter in the CPU 1 and allows a next instruction to be fetched from the address APP.

In step S6, as the instruction to jump to the address SYS is stored at the address APP, the CPU 1 executes the instruction to jump to the address SYS next. When fetching of the instruction at the address SYS is detected, the selector 12 in the test circuit 10 is switched to the register side. As a result, the specific instruction stored in the register 11, e.g., a subroutine return instruction, is given to the CPU 1. The CPU 1 fetches and executes the subroutine return instruction.

In step S7, it is determined whether or not the execution of the subroutine return instruction has brought about an exceptional state. If the security circuit 7 or its output system has a failure, an exceptional does not occur so that the flow proceeds to step S8. If the security circuit 7 is operating properly, on the other hand, an exceptional state occurs so that the flow proceeds to step S9.

In step S8, as an exceptional state does not occur due to a failure in the security circuit 7, the subroutine return instruction is executed and the top address JDG1 of the failure decision routine 1 stored in the stack is popped up and instruction execution by the CPU 1 follows. After step S8, the flow goes to step S10.

In step S9, an exceptional state occurs as a result of the normal operation and the flow jumps to a predetermined exceptional process routine. In the exceptional process routine, an interruption flag is set to memorize the occurrence of the exceptional state and a instruction to return from the exceptional process routine is executed. After step S9, the flow goes to step S10.

In step S10, as the top address JDG1 of the failure decision routine 1 is stored in the stack, instruction execution by the CPU 1 jumps to the failure decision routine 1.

In step S11, the failure decision routine 1 outputs the result of a decision on the presence or absence of a failure to the outside via the terminal SIO in accordance with the status of the interruption flag. That is, when the interruption flag is set, the failure decision routine 1 outputs a signal indicating the occurrence of no failure, whereas when the interruption flag is not set, the failure decision routine 1 outputs a signal indicating the presence of a failure. This can allow the security circuit 7 to know the presence/absence of a failure.

FIG. 4 illustrates process procedures of a program to test if there is a failure which inhibits execution of a instruction on the ROM 2 when the application program stored in the RAM 4 jumps to that area in the ROM jumping to which is permitted. As in the case of FIG. 3, it is assumed here that jump from the address APP in the RAM 4 where the application program is stored to the address SYS in the ROM 2 where the OS is stored has been permitted. Same symbols are given to those steps in FIG. 4 whose process contents are same as the corresponding steps in FIG. 3.

Instead of steps S3, S4 and S7 to S11 in FIG. 3, the process in FIG. 4 has steps S3A, S4A and S7A to S11A which are slightly different in process contents from the former steps.

In step S3A, the security circuit 7 is set so as to permit the execution of the program at the address APP in the application program.

In step S4A, a top address JDG2 in a failure decision routine 2 in the test program is pushed in the stack.

In step S7A, it is determined whether or not the execution of the subroutine return instruction has brought about an exceptional state. If the security circuit 7 is operating properly, an exceptional state does not occur so that the flow proceeds to step S8A. If the security circuit 7 or its output system has a failure, on the other hand, an exceptional state does occurs so that the flow proceeds to step S9A.

In step S8A, an exceptional state does not occur as the result of the normal operation, so that the subroutine return instruction is executed and the top address JDG2 of the failure decision routine 2 stored in the stack is popped up and instruction execution by the CPU 1 follows. After step S8A, the flow goes to step S10A.

In step S9A, an exceptional state occurs due to the occurrence of a failure, so that the flow jumps to a predetermined exceptional process routine. In the exceptional process routine, the interruption flag is set to memorize the occurrence of the exceptional state and a instruction to return from the exceptional process routine is executed. After step S9A, the flow goes to step S10A.

In step S10A, as the top address JDG2 of the failure decision routine 2 is stored in the stack, instruction execution by the CPU 1 jumps to the failure decision routine 2.

In step S11A, the failure decision routine 2 outputs the result of a decision on the presence or absence of a failure to the outside via the terminal SIO in accordance with the status of the interruption flag. That is, when the interruption flag is set, the failure decision routine 1 outputs a signal indicating the presence of a failure, whereas when the interruption flag is not set, the failure decision routine 1 outputs a signal indicating the occurrence of no failure. The other processes are the same as those in FIG. 3.

The microcomputer according to the embodiment has the following advantages.

(1) Because the microcomputer does not require further external connection terminals or test pads on the chip other than the terminals CLK, RST, SIO, VDD and GND, there is less danger that a malignant third party would violate the security.

(2) As the microcomputer is designed in such a way as to change the address of the jumping destination depending on the presence or absence of a failure, a test on the security circuit 7 can be carried out in two failure modes, one in case where the level of the illegitimate access detection signal IL is fixed to "L" and the other in case where the level of the illegitimate access detection signal IL is fixed to "H".

(3) In the test mentioned in the advantage (2), a test on the permission or inhibition of jump to the ROM 2 from an area in the application program in the RAM 4 can be made without executing a program inside the OS in the ROM 2. Therefore, the test program can be created without knowing the contents of the OS.

(4) Because, as the CPU 1 and the memories 2 to 4, conventional components available can be used, it is possible to minimize the number of changes that should be made to an existing microcomputer.

The invention is not limited to the above-described embodiment but may be modified in various other forms.

FIGS. 5A to 5D structural diagrams showing modifications of the microcomputer in FIG. 1 which have advantages similar to those of the embodiment.

Figure 5A:
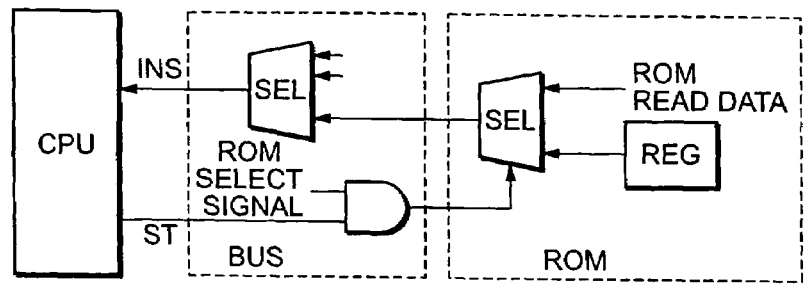
FIGS. 5A to 5D are structural diagrams showing modifications of the microcomputer in FIG. 1.

The microcomputer in FIG. 5A is designed in such a way that a selector for testing the security circuit is provided inside a memory (ROM), instead of a test circuit provided between the bus and the CPU, and data read from the memory is output in the normal operation mode and a specific instruction stored in the register is output when a security test is designated.

Figure 5B:
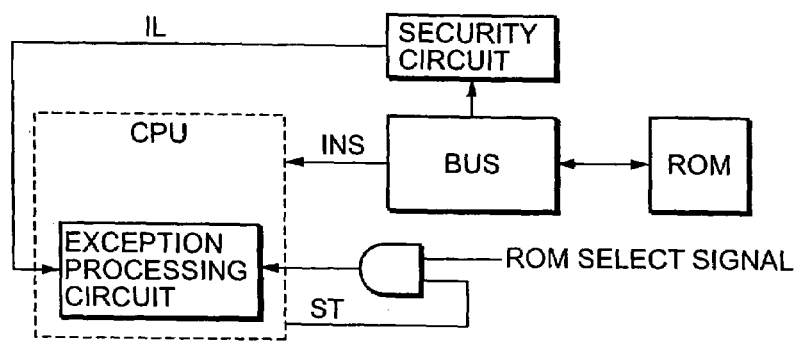

The microcomputer in FIG. 5B is designed in such a way that an exception processing circuit is provided inside the CPU and an exceptional state is caused to occur or the mode is shifted to a special operation mode in case where the security circuit detects an illegitimate access when the security test is designated and a memory to be tested is selected.

Figure 5C:
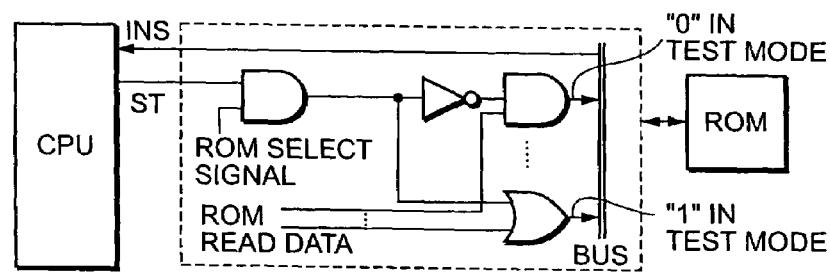

The microcomputer in FIG. 5C is designed in such a way that when the security test is designated and a memory to be tested is selected, those bits in a bit pattern of a instruction read from the memory which are to be set to "1" are replaced with OR gates and those bits which are to be set to "0" are replaced with AND gates. In this circuit, data read from the memory is given to the CPU via the AND gates or OR gates in the normal operation mode.

Figure 5D:
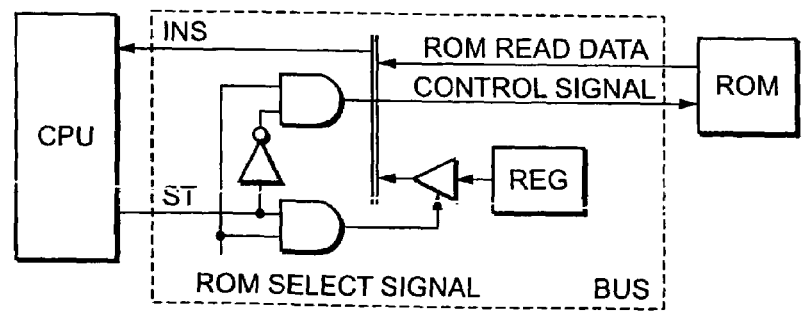

The microcomputer in FIG. 5D is designed in such a way that when the security test is designated, a control signal to a memory is inhibited from becoming active and a tristate buffer is used to output a specific instruction code to the bus from the register.

According to the invention, as elaborated above, the microcomputer has a test circuit which provides the CPU with a preset specific instruction when the security test signal is output from the CPU in test mode and when a specific memory area is accessed. Therefore, prestoring a functional test program in the second memory can permit a predetermined functional test to be carried out and can eliminate the need for provision of test pads. This leads to an improved security. Further, if a instruction to cause an illegitimate access is set as a specific instruction, the microcomputer has such an advantage as to make it possible to check the operation of the memory management unit.

What is claimed is:

1. A microcomputer comprising:
   a first memory where a normal-operation program is stored;
   a second memory where a functional test program is stored;
   a test mode detection circuit which monitors a signal supplied through an external terminal and detects if a test mode is designated;
   a central processing unit (CPU) which accesses said first memory and runs said normal-operation program when said test mode is not designated, and accesses said second memory and runs said functional test program when said test mode is designated;
   a memory management unit which monitors an access address and data with respect to said first and second memories and causes said CPU to execute a specific operation when there has been an unauthorized illegitimate access; and
   a test circuit which sends a preset specific instruction to said CPU when, in said test mode, a security test signal has been output from said CPU and a specific memory area of said first and second memories has been accessed,
   wherein the preset specific instruction is provided from a register within said test circuit.

2. The microcomputer according to claim 1, wherein said specific instruction given to said CPU from said test circuit is an instruction which is to be detected by said memory management unit as an illegitimate access.

3. A microcomputer comprising:
   a first memory where a normal-operation program is stored;
   a second memory where a functional test program is stored;
   a test mode detection circuit which monitors a signal supplied through an external terminal and detects if a test mode is designated;
   a central processing unit (CPU) which accesses said first memory and runs said normal-operation program when said test mode is not designated, and accesses said second memory and runs said functional test program when said test mode is designated;
   a memory management unit which monitors an access address and data with respect to said first and second memories and causes said CPU to execute a specific operation when there has been an unauthorized illegitimate access; and
   an exception processing circuit, included in said CPU, for executing a predetermined exception process responsive to a signal indicative of an unauthorized illegitimate access of said first and second memories when said functional test program is executing a security test and said memory management unit has instructed execution of said specific operation.

* * * * *